United States Patent
Brundridge et al.

(10) Patent No.: US 8,032,768 B2
(45) Date of Patent: Oct. 4, 2011

(54) SYSTEM AND METHOD FOR SMOOTHING POWER RECLAMATION OF BLADE SERVERS

(75) Inventors: Michael Brundridge, Georgetown, TX (US); Alan Brumley, Cedar Park, TX (US); Ashish Munjal, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 623 days.

(21) Appl. No.: 12/143,522

(22) Filed: Jun. 20, 2008

(65) Prior Publication Data

US 2009/0319808 A1    Dec. 24, 2009

(51) Int. Cl.
G06F 1/26    (2006.01)
(52) U.S. Cl. ........................................ 713/300; 710/104
(58) Field of Classification Search .................. 713/300; 710/104
See application file for complete search history.

(56) References Cited

U.S. PATENT DOCUMENTS

| | | | |
|---|---|---|---|
| 6,289,212 B1 | 9/2001 | Stein et al. | |
| 6,542,176 B1 | 4/2003 | Camis | |
| 6,826,758 B1 | 11/2004 | Chew et al. | |
| 6,865,585 B1 | 3/2005 | Dussud | |
| 6,961,944 B2 | 11/2005 | Chew et al. | |
| 7,308,449 B2 | 12/2007 | Fairweather | |
| 7,702,931 B2* | 4/2010 | Goodrum et al. | 713/300 |
| 2006/0136754 A1 | 6/2006 | Liu et al. | |
| 2006/0242462 A1 | 10/2006 | Kasprzak | |
| 2007/0245162 A1 | 10/2007 | Loffink et al. | |
| 2007/0260896 A1 | 11/2007 | Brundridge et al. | |
| 2008/0077817 A1 | 3/2008 | Brundridge et al. | |
| 2009/0113221 A1* | 4/2009 | Holle et al. | 713/310 |
| 2009/0132842 A1* | 5/2009 | Brey et al. | 713/322 |

OTHER PUBLICATIONS

U.S. Appl. No. 12/188,502, filed Aug. 8, 2008.
U.S. Appl. No. 12/018,853, filed Jan. 24, 2008.
U.S. Appl. No. 12/135,320, filed Jun. 29, 2008.
U.S. Appl. No. 12/135,323, filed Jun. 9, 2008.
U.S. Appl. No. 11/777,528, filed Jul. 13, 2007.

* cited by examiner

Primary Examiner — Albert Wang
(74) Attorney, Agent, or Firm — Larson Newman, LLP

(57) ABSTRACT

A modular enclosure including first, second, third, and fourth servers, and a chassis management controller. The first, second, and third servers each have reclaimable power. The fourth server is configured to request a specific amount of power needed to complete a power-on request received at the fourth server. The chassis management controller is in communication with each of the first, second, third, and fourth servers. The chassis management controller is configured to reassign all the reclaimable power of the first server and to reassign a portion of the reclaimable power of the second and third servers to the fourth server.

20 Claims, 5 Drawing Sheets

SYSTEM AND METHOD FOR SMOOTHING POWER RECLAMATION OF BLADE SERVERS

FIELD OF THE INVENTION

This disclosure generally relates to information handling systems, and more particularly relates to a system and method for smoothing power reclamation of blade servers.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In a blade server rack, a priority rating may be assigned to each blade server. As blade servers are added to and/or removed from the rack, an amount of power provided to each blade server may change based on the priority level of the blade server added to or removed from the server rack. If a high priority blade server is added to the server rack, the amount of power provided to one or more lower priority blade servers may be reduced so that the higher priority blade server receives the proper amount of power. The lower priority blade servers have their power correspondingly reduced.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Figure 1:
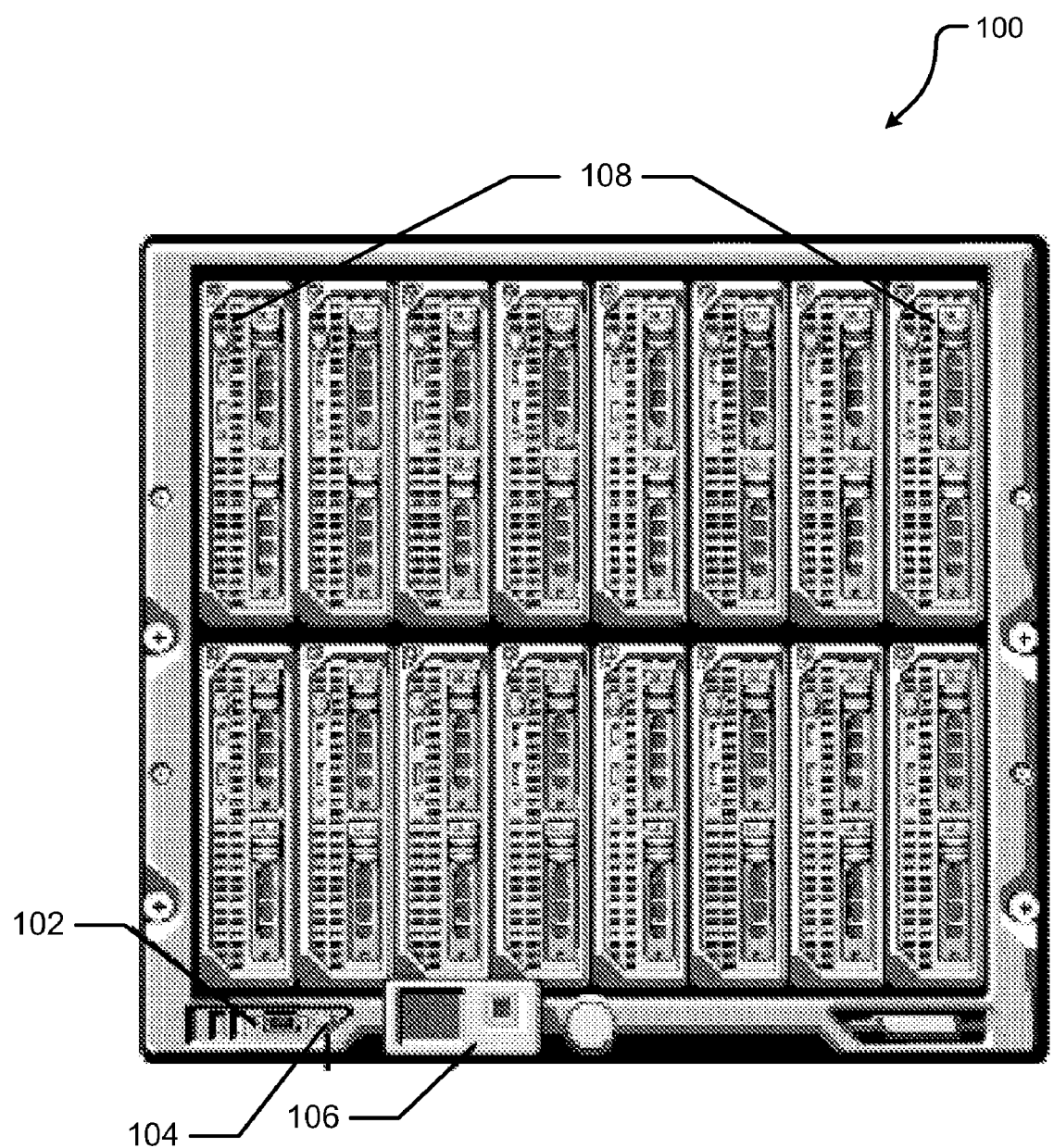
FIG. 1 is a plan view of a front panel of a blade server rack.

FIG. 1 shows a plan view of a front panel of a modular enclosure, such as a blade server rack 100 of an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The blade server rack 100 includes a keyboard video monitor (KVM) port 102, a power button 104, and a liquid crystal display (LCD) 106. The blade server rack 100 is adapted to accept a plurality of servers, such as blade servers 108. The blade server rack 100 may be installed in a server chassis (not shown) such that the blade servers 108 can be connected to each other and/or to other servers to form a network. The KVM port 102 is configured to enable a user to connect a keyboard, a display monitor, or a mouse (not shown) to the blade server rack 100 and further configured to enable communication between the blade servers 108 and the keyboard, the display monitor, and the mouse. The power button 104 turns the power on and off to the entire blade server rack 100. The LCD 106 can allow the user to check the status of the blade servers 108. The blade servers 108 can perform a variety of tasks, such as running software applications and storing and accessing data.

Figure 2:
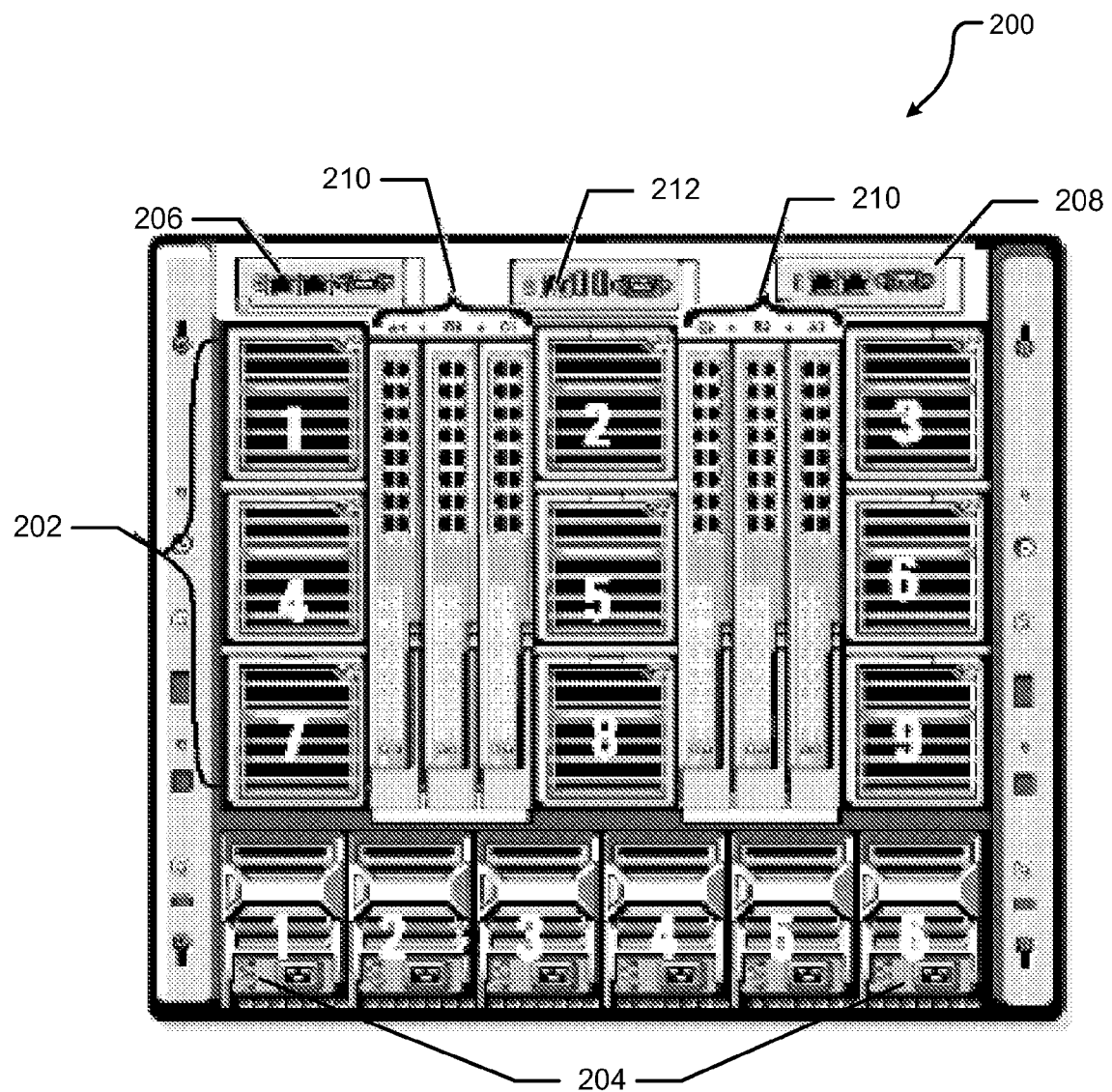
FIG. 2 is a plan view of a back panel of the blade server rack.

FIG. 2 shows a plan view of a rear panel of the blade server rack 100 including a plurality of cooling fans 202, a plurality of power supplies 204, chassis management controllers (CMCs) 206 and 208, a plurality of input output modules (IOMs) 210, and a local KVM 212. The cooling fans 202 provide airflow over the different components of the blade server rack 100. The power supplies 204 provide power to the different components of the blade server rack 100. The CMCs 206 and 208 can control the power management in the blade server rack 100. The IOMs 210 can enable the user to communicate with the blade servers 108 from a remote location. The local KVM 212 can allow the user to communicate with the blade servers 108, to check the current status of the blade servers, and the like from the keyboard, the display monitor, and the mouse connected to the blade server rack 100.

Figure 3:
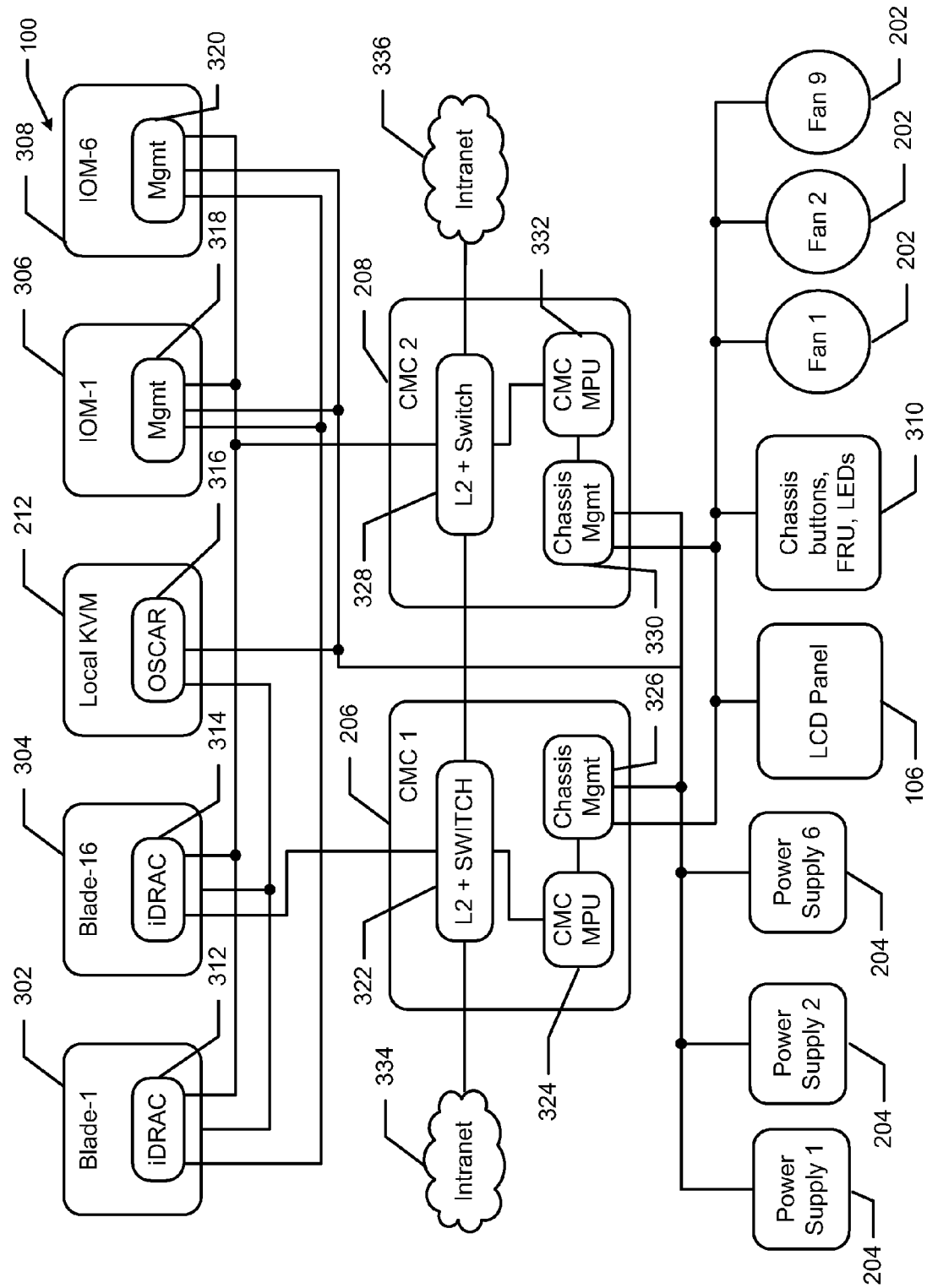
FIG. 3 is a block diagram of a plurality of components within the blade server rack.

FIG. 3 shows a block diagram of the blade server rack 100 including blade servers 302 and 304, IOMs 306 and 308, and a chassis button module 310 (including the power button 104). The blade server 302 includes a Dell remote access controller (DRAC) 312, and the blade server 304 includes a DRAC 314. The local KVM 212 includes an open source cluster application resource (OSCAR) module 316. The IOM 306 includes a management module 318, and the IOM 308 includes a management module 320. The CMC 206 includes a layer 2 switch 322, a CMC microprocessor unit (MPU) 324, and a chassis management module 326. The CMC 208 includes a layer 2 switch 328, a CMC MPU 330, and a chassis management module 332.

The blade server 302 is coupled to the blade server 304 and to the OSCAR module 316. The DRAC 312 is connected to the DRAC 314, to the management module 318, to the management module 320, and to the layer 2 switch 328. The blade server 304 is connected to the OSCAR module 316. The DRAC 314 is connected to the management module 318, to the management module 320, and to the layer 2 switch 322.

The OSCAR module 316 is connected to the management module 318, to the management module 320, to the chassis management module 326, the chassis management module 330, and the power supplies 204. The management module 318 is connected to the management module 320, to the layer 2 switch 328, to the chassis management module 326, to the chassis management module 330, and to the power supplies 204. The management module 320 is connected to the chassis management module 326, to the layer 2 switch 328, to the chassis management module 330, and to the power supplies 204.

The layer 2 switch 322 is connected to the CMC MPU 324, to the layer 2 switch 328, and to Intranet 334. The CMC MPU 324 is connected to the chassis management module 326. The chassis management module 326 is connected to the power supplies 204, to the LCD panel 106, to the chassis button module 310, and to the fans 202. The layer 2 switch 328 is connected to the CMC MPU 332, and to the Intranet 336. The CMC MPU 332 is connected to the chassis management module 326. The chassis management module 330 is connected to the power supplies 204, to the LCD panel 106, to the chassis button module 310, and to the fans 202.

The DRAC 312 can determine a maximum power requirement and a minimum power requirement for the blade server 302. The maximum power requirement is the total amount of power needed when all of the components within the blade server 302 are operating at a full load. The minimum power requirement is the amount of power needed to power on the blade server 302 with only a few of the components operating. Upon the DRAC 312 receiving a power on request, the DRAC can request to receive the maximum power requirement for the blade server 302.

The DRAC 314 can determine a maximum power requirement and a minimum power requirement for the blade server 304. The maximum power requirement is the total amount of power needed when all of the components within the blade server 304 are operating at a full load. The minimum power requirement is the amount of power needed to power on the blade server 304 with only a few of the components operating. Upon the DRAC 314 receiving a power on request, the DRAC can request to receive the maximum power requirement for the blade server 304.

During operation, a new blade server can be added to the blade server rack 100 or a blade server already plugged into the blade server rack, such as blade server 302, can receive a power on request from the local KVM 212, from the CMC 206, from a remote user through the IOMs 306, through the layer 2 switch 322 from the user accessing a remote DRAC website. In either situation, the DRAC module 312 can send a power request to chassis management module 326. The CMC MPUs 324 can perform of set of instructions stored in a memory (not shown) of the CMC 206 to carry out a power reallocation process when a new blade server is added to the blade server rack 100. Even though the reallocation process is only described with reference to CMC 206, it should be understood that the process could be performed by either the CMC 206 or 208, or by both of the CMCs.

Upon receiving the power request, the CMC 206 can determine whether there is enough unused power available from the power supplies 204 to fulfill the power request from the blade server 302. If there is not enough unused power, then chassis management module 326 can throttle the blade servers down to the minimum power requirement. The chassis management module 326 also can request to receive a priority level of each of the blade servers 108 and an average amount of power used by each of the blade servers from the DRACs. The priority level can differ for each blade server 108 in the blade server rack 100, and multiple blade servers can have the same priority level. For example, if there are sixteen blade servers in the blade server rack 100, then three of the blade servers can have a lowest priority level, twelve of the blade servers can have a middle priority level, and one can have a highest priority level. The priority levels can be numbered such that a level one priority represents the highest priority level, a level two priority represents the middle priority level, and a level three priority represents the lowest priority level.

To provide the blade server 302 with an amount of power equal to the power request, the CMC 206 can reassign a portion of reclaimable power in the blade servers 108, such as the blade server 304, to the blade server 302. Reclaimable power can be the difference between the maximum amount of power required by each of the blade servers 108 and the minimum amount of power required by the blade servers. The CMC 206 can determine whether there is enough reclaimable power in the lowest priority blade servers to fulfill the power request from the blade server 302. If there is enough reclaimable power, then the CMC 206 can reset a throttle current sensor (not shown) in the lowest priority blade servers so that these blade servers only operate at the minimum power requirement. The chassis management module 326 can inform the DRAC 312 that the blade server 302 can use the amount of power equal to the power request.

If there is not enough power to fulfill the power request, then the CMC 206 can determine an additional amount of power needed to fulfill the power request. The CMC 206 also can determine a percentage of power needed to be taken from the blade servers having an equal priority level, such as level two priority, to fulfill the power request. The CMC 206 can reset the throttle current sensor on the blade servers having the level two priority such that these blade servers can only draw a lower amount of power than the maximum amount allocated by the CMCs. Thus, the CMC 206 reduces the maximum amount of power level in all of the blades having the same priority level instead of reclaiming all of the power from a few blade servers of the plurality of blade servers having equal priority. The chassis management module 326 can assign the reclaimed power to the blade server 302 having the highest priority.

Figure 4:
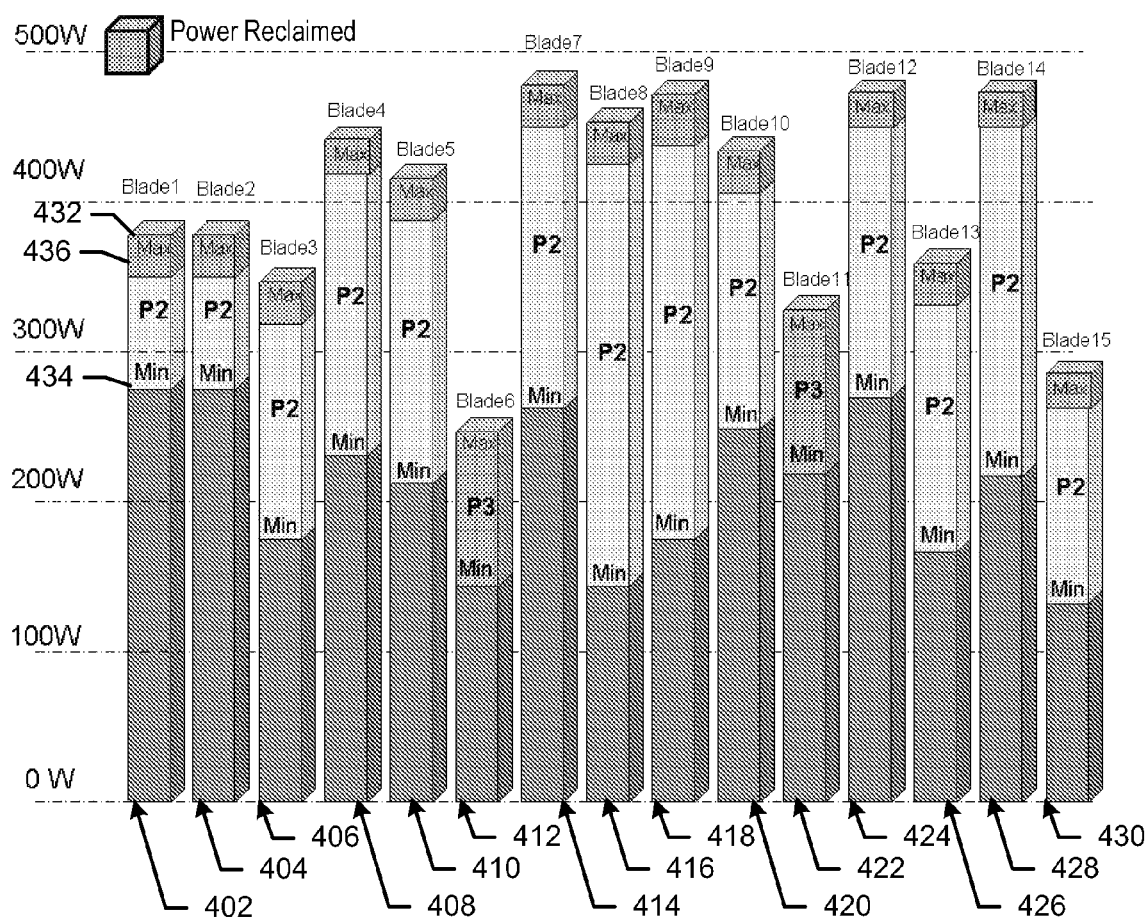
FIG. 4 is a graph of an amount of power provided to a plurality of blade servers in the blade server rack.

FIG. 4 shows a plurality of bars 402-430 representing an amount of power allocated to the blade servers 108. Bars 402-410, 414-420, and 424-430 represent the allocated power to the blade servers having a level two priority. Bars 412 and 422 represent the blade servers having a level three priority. The bars 402-430 also show the maximum power requirement 432 and the minimum power requirement 434 for each of the blade servers 108 in the blade server rack 100. Additionally, the bars 402-430 show the amount of power reclaimed 436 from each of the blade servers 108 when a new blade server having a level one priority is added to the blade server rack 100. In a particular embodiment, the reclaimed power 436 for the blade servers having the level three priority is equal to all of the reclaimable power for the blade servers as shown by bars 414 and 422. The reclaimable power is the difference between the maximum power requirement 432 and the minimum power requirement 434. The power reclaimed 436 in the blade servers having the level two priority is only a percentage of the reclaimable power as shown by the bars 402-410, 414-420, and 424-430.

Figure 5:
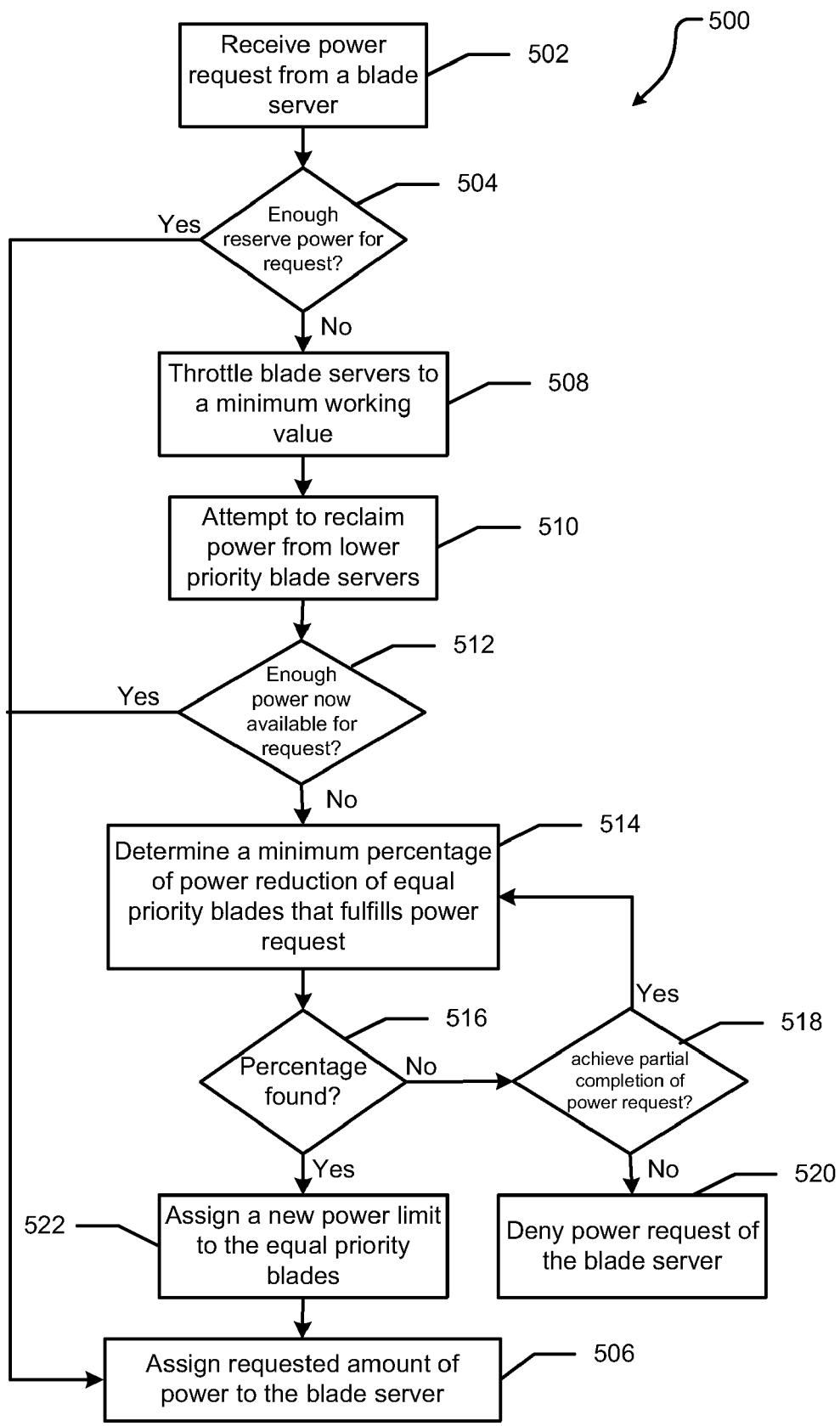
FIG. 5 is a flow diagram of a method for reclaiming power in the blade server rack to power on a high priority blade server.

The CMCs 206 and 208 can control the power allocation to the different blade servers 108 within the blade server rack 100 so that enough power is reclaimed to provide a high priority blade server with an amount of power requested for power on. FIG. 5 shows a flow diagram of a method 500 for reclaiming power in a blade server rack to power on a high priority blade server. At block 502, a power request is received from a blade server. A determination is made whether there is enough unused power in the server rack to provide the blade server with the full power request at block 504. If there is enough unused power, then the requested amount of power is assigned to the blade server at block 506. At block 508, if there is not enough unused power, then the other blade servers in the server rack are throttled back to a minimum working power value. The minimum working power value for a blade server is the smallest amount of power needed for the blade server to be able to operate.

At block 510, the amount of power needed for the power request is attempted to be reclaimed from the lowest priority blade servers. A determination is made whether enough power is now available for the power request at block 512. If enough power is now available for the power request, then the requested amount of power is assigned to the blade server at block 506. If enough power is not available for the power request, then a minimum percentage of power reduction of equal priority blade servers needed to fulfill the power request is determined at block 514. At block 516, a determination is made whether the minimum percentage is found. If the minimum percentage is not found, then a determination is made whether a partial completion of the power request can be achieved at block 518. If a partial completion of the power request can be achieved, then the flow diagram continues as stated above at block 514. If a partial completion of the power request cannot be achieved, then the power request from the blade server is denied at block 520. If the minimum percentage is found, then a new power limit is assigned to the equal priority blade servers at block 522. The requested amount of power is assigned to the blade server at block 506.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A modular enclosure comprising:
   first, second, and third servers each having reclaimable power;
   a fourth server configured to request a specific amount of power needed to complete a power-on request received at the fourth server; and
   a chassis management controller in communication with each of the first, second, third, and fourth servers, the chassis management controller configured to reassign all of the reclaimable power of the first server, to reassign a portion of the reclaimable power of the second and third servers to the fourth server, to set a first throttle current sensor limit for the first server based on the reclaimable power of the first server, and to set a second throttle current sensor limit for each of the second and third servers based on the portion of the reclaimable power of the second and third servers.

2. The modular enclosure of claim 1 wherein the reclaimable power is reassigned to the fourth server from the first, second, and third servers based on priority levels of the first, second, third, and fourth servers.

3. The modular enclosure of claim 2 wherein the priority level of the first server is below the priority level of each of the second and third servers, and the priority level each of the second and third servers is below the priority level fourth server.

4. The modular enclosure of claim 1 wherein the chassis management controller is further configured to receive a priority level and an average power consumption for each of the first, second, and third servers.

5. The modular enclosure of claim 1 further comprising:
   an input output module coupled to each of the first, second, third, and fourth servers, the input output module configured to provide a communication between a remote user and each of the first, second, third, and fourth servers, and further configure to provide the power-on request to the fourth server from a remote user.

6. The modular enclosure of claim 1 wherein the first, second, third, and fourth servers are blade servers.

7. The modular enclosure of claim 1 further comprising:
   a keyboard video mouse module coupled to each of the first, second, third, and fourth servers, the keyboard video mouse module configured to provide the power-on request to the fourth server.

8. The modular enclosure of claim 1 wherein the power-on request is received at the fourth server from the chassis management controller.

9. The modular enclosure of claim 1 wherein the power-on request is received at the fourth server from a remote website for controlling a module of the fourth server.

10. A method of reassigning power in a system, the method comprising:
    receiving a power request from a first server;
    determining that there is not enough unused power in the system to fulfill the power request;
    attempting to reclaim an amount of power needed for the power request from reclaimable power of a second server;
    determining that the reclaimable power of the second server does not fulfill the power request;
    determining a minimum percentage of power reduction of each of third and fourth servers that fulfills a remainder of the power request;
    setting a throttle current sensor limit for each of the third and fourth servers based on the minimum percentage of power reduction; and
    assigning the amount of power associated with the power request to the first server.

11. The method of claim 10 further comprising:
    throttling each of the second, third, and fourth servers to a minimum working power value prior to attempting to reclaim the amount of power needed for the power request.

12. The method of claim 10 further comprising:
    assigning a power limit to each of the second, third, and fourth servers.

13. The method of claim 10 wherein the reclaimable power is a difference between a maximum power requirement and a minimum power requirement for each of the second, third, and fourth servers.

14. The method of claim 10 wherein a priority level of the first server is higher than the priority levels of each of the third and fourth servers.

15. The method of claim 14 wherein the priority levels of each of the third and fourth servers is higher than the priority level of the second server.

16. A method comprising:
  receiving a power request from a first server;
  determining a priority level of the first server;
  determining the priority levels of each of second and third servers;
  determining that the priority level of each of the second and third servers is lower than the priority level of the first server;
  determining a minimum percentage of power reduction for each of the second and third servers based on an amount of power to fulfill the power request;
  setting a throttle current sensor limit for each of the second and third servers based on the minimum percentage of power reduction; and
  assigning the amount of power to fulfill the power request to the first server.

17. The method of claim 16 further comprising:
  determining reclaimable power amount for a fourth server; and
  assigning the reclaimable power amount to the first server prior to determining the minimum percentage of power reduction for each of the second and third servers.

18. The method of claim 17 further comprising:
  determining the priority level for the fourth server; and
  determining that the priority level of the fourth server is below the priority levels of each of the second and third prior to determining the reclaimable power amount for the fourth server.

19. The method of claim 17 wherein the reclaimable power amount is a difference between a maximum power requirement allocated and a minimum power requirement for the fourth server.

20. The method of claim 16 further comprising:
  preventing each of the second and third servers from drawing more power than allocated based on the throttle current sensor limit.

* * * * *